US009277637B2

(12) United States Patent
Nozawa et al.

(10) Patent No.: US 9,277,637 B2
(45) Date of Patent: Mar. 1, 2016

(54) APPARATUS FOR PLASMA TREATMENT AND METHOD FOR PLASMA TREATMENT

(75) Inventors: Toshihisa Nozawa, Sendai (JP); Caizhong Tian, Osaka (JP); Masaru Sasaki, Miyagi (JP); Naoki Mihara, Miyagi (JP); Naoki Matsumoto, Miyagi (JP); Kazuki Moyama, Sendai (JP); Jun Yoshikawa, Sendai (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 13/885,708

(22) PCT Filed: Nov. 16, 2011

(86) PCT No.: PCT/JP2011/006391
§ 371 (c)(1),
(2), (4) Date: Jul. 22, 2013

(87) PCT Pub. No.: WO2012/066779
PCT Pub. Date: May 24, 2012

(65) Prior Publication Data
US 2013/0302992 A1    Nov. 14, 2013

Related U.S. Application Data

(60) Provisional application No. 61/458,153, filed on Nov. 17, 2010.

(51) Int. Cl.
*H01L 21/306* (2006.01)
*H05H 1/46* (2006.01)
*H01J 37/32* (2006.01)

(52) U.S. Cl.
CPC ............. *H05H 1/46* (2013.01); *H01J 37/3244* (2013.01); *H01J 37/32192* (2013.01); *H01J 37/32211* (2013.01)

(58) Field of Classification Search
CPC ............ H05H 1/46; H05H 2001/4607; H05H 2001/4622; H05H 2001/4682; H05H 2001/481; H05H 2001/469; H01J 37/32192; H01J 37/32211; H01L 21/02274
USPC ............. 156/345.35, 345.36, 345.41, 345.42, 156/345.44; 438/706, 710, 712, 714, 726
See application file for complete search history.

(56) References Cited

U.S. PATENT DOCUMENTS 5,134,965 A * 8/1992 Tokuda et al. ........ 118/723 MW
5,389,154 A * 2/1995 Hiroshi et al. ......... 118/723 MR
(Continued)

FOREIGN PATENT DOCUMENTS

| CN | 101604624 A | 12/2009 |
|---|---|---|
| JP | 9-115880 A | 5/1997 |

(Continued)

OTHER PUBLICATIONS

International Search Report mailed Feb. 14, 2012 in PCT/JP2011/006391.

*Primary Examiner* — Lan Vinh
(74) *Attorney, Agent, or Firm* — Rothwell, Figg, Ernst & Manbeck, P.C.

(57) ABSTRACT

An apparatus for plasma treatment contains a process vessel provided with a mounting table for mounting a substrate, a first gas supplying unit configured to supply a first gas into the process vessel, a first plasma generating unit configured to convert at least a part of the first gas to a first plasma, a second gas supplying unit configured to supply a second gas into the process vessel, and a second plasma generating unit configured to convert at least a part of the second gas to a second plasma. A height of ea an inlet of the second gas from the mounting table is lower than a height of an inlet of the first gas from the mounting table.

19 Claims, 7 Drawing Sheets

(56) References Cited

U.S. PATENT DOCUMENTS

| | | | |
|---|---|---|---|
| 6,450,117 B1* | 9/2002 | Murugesh et al. | 118/723 ME |
| 2001/0008806 A1* | 7/2001 | Kitagawa | 438/712 |
| 2005/0263071 A1* | 12/2005 | Yagi et al. | 118/715 |
| 2006/0024451 A1* | 2/2006 | Mungkekar et al. | 427/569 |
| 2006/0225654 A1* | 10/2006 | Fink | 118/723 R |
| 2009/0311872 A1 | 12/2009 | Ueda et al. | |

FOREIGN PATENT DOCUMENTS

| | | |
|---|---|---|
| JP | 2003-142460 A | 5/2003 |
| JP | 2009-302324 A | 12/2009 |
| KR | 10-2009-0129948 A | 12/2009 |
| KR | 10-2010-0105787 A | 9/2010 |
| WO | 2009/107718 A1 | 9/2009 |
| WO | 2010/058642 A1 | 5/2010 |

\* cited by examiner

Fig. 5
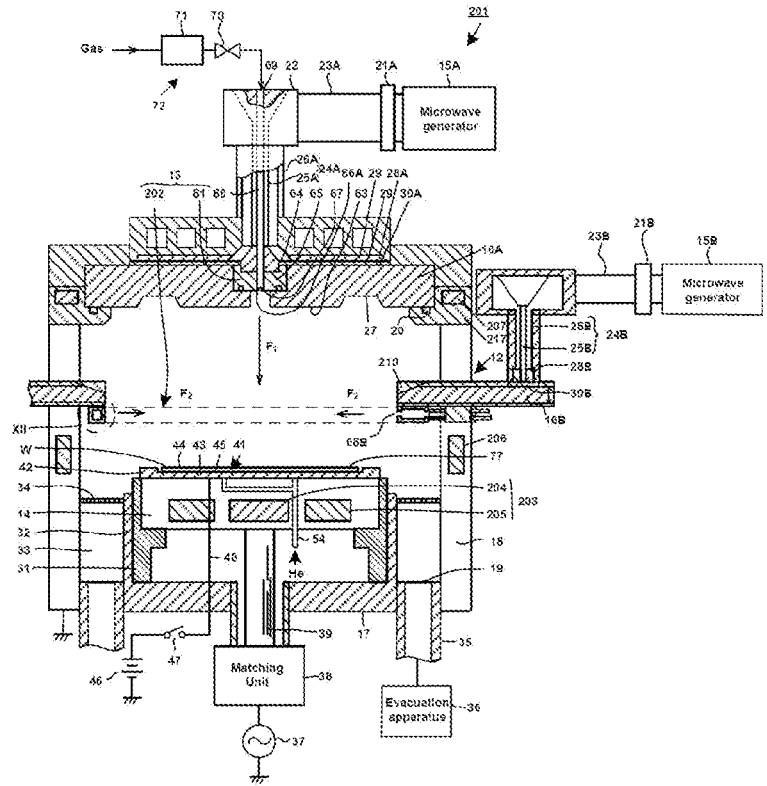
Fig. 6-A
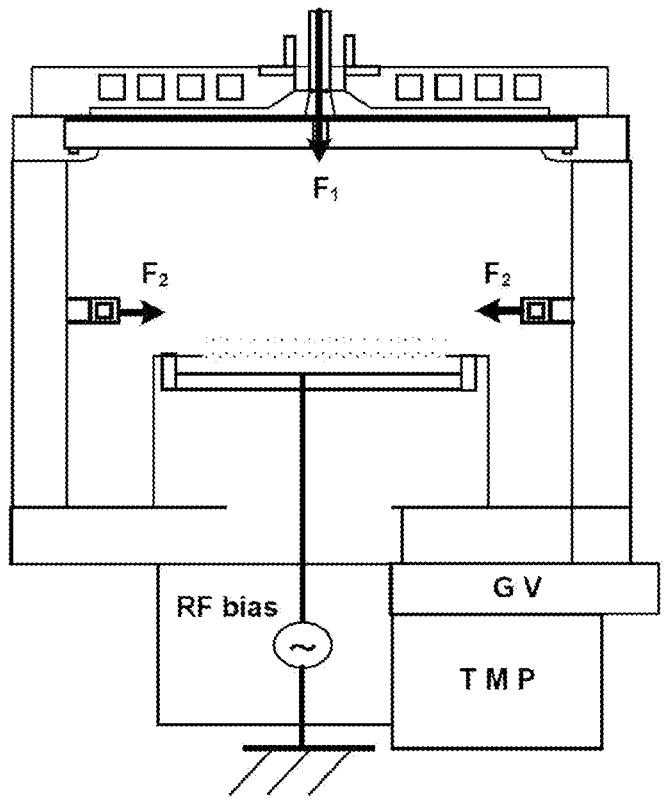

Fig. 6-B
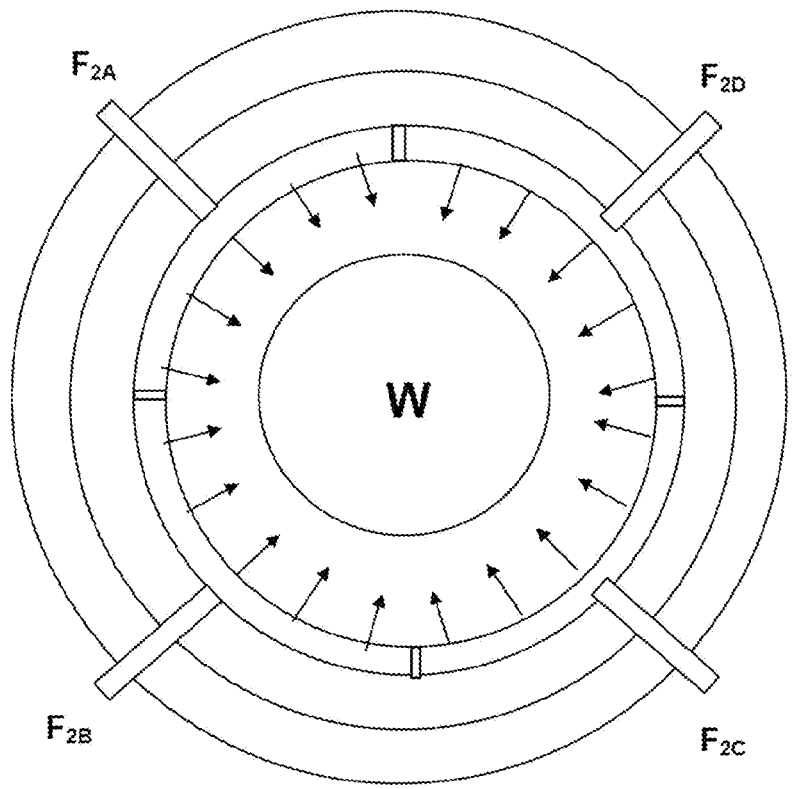
Fig. 7-A
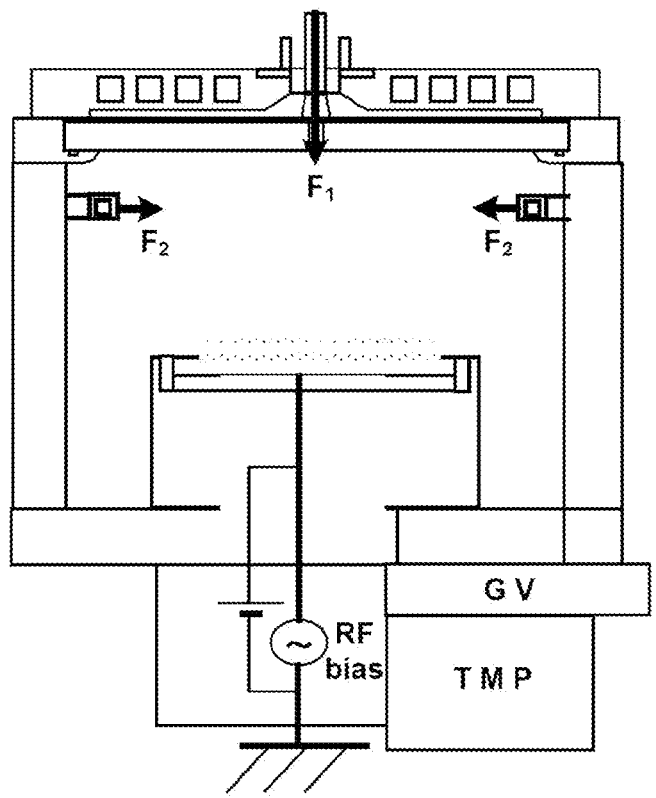

Fig. 7-B
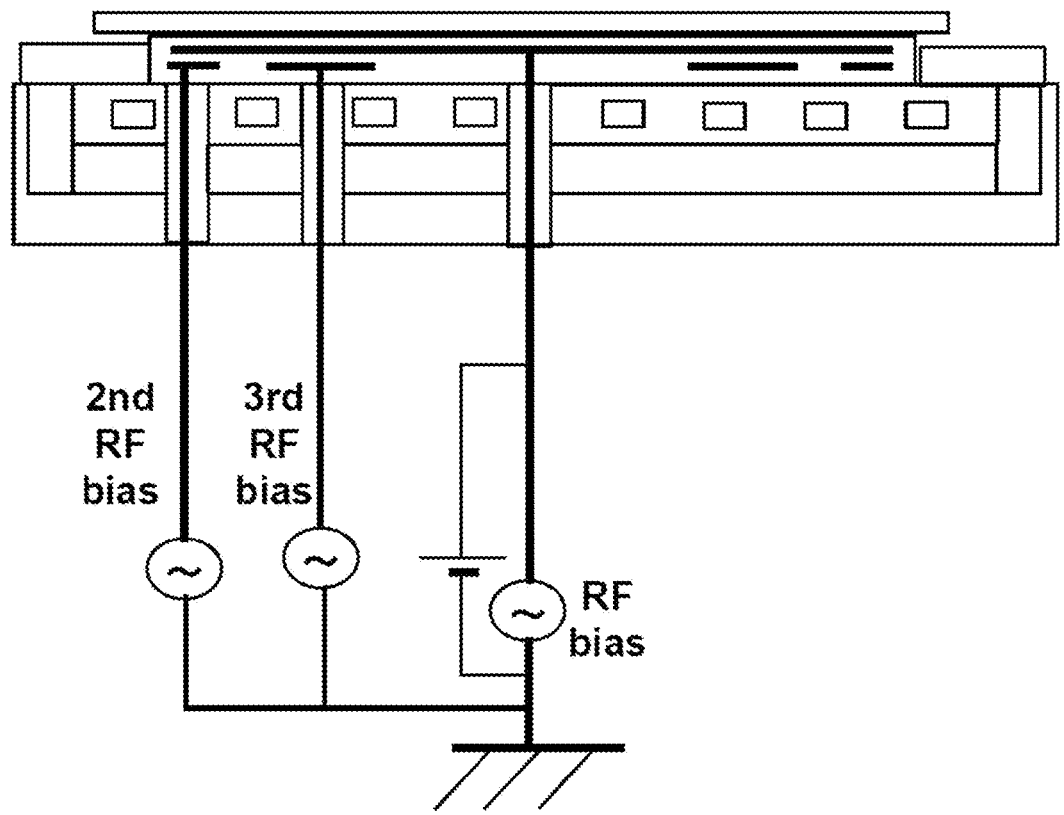
Fig. 8
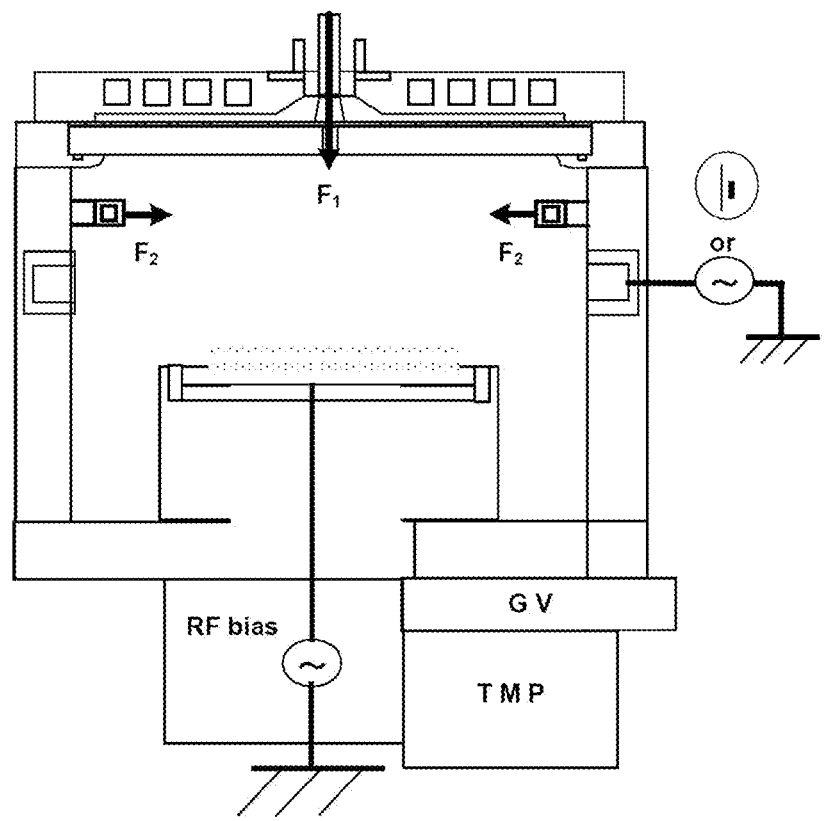

APPARATUS FOR PLASMA TREATMENT AND METHOD FOR PLASMA TREATMENT

CROSS REFERENCE TO RELATED APPLICATION

This application is a 35 U.S.C. 371 National Phase Entry Application from PCT/JP2011/006391, filed Nov. 16, 2011, which claims the benefit of U.S. Provisional Application Ser. No. 61/458,153, filed Nov. 17, 2010, the disclosures of which are incorporated herein in their entirety by reference.

TECHNICAL FIELD

The present invention relates to an apparatus for plasma treatment and a method for plasma treatment.

BACKGROUND ART

Semiconductor devices such as LSI (Large Scale Integrated circuit) and MOS (Metal Oxide Semiconductor) are manufactured by subjecting a substrate such as a semiconductor wafer and a glass substrate to such treatments as etching, CVD (Chemical Vapor Deposition), and sputtering. Here, plasma can be employed as an energy source for such treatments. Examples of such plasma treatments include: plasma etching, plasma CVD, plasma ALD, plasma sputtering, and plasma doping.

In manufacturing the semiconductor devices, uniform in-plane treatment of the substrate is demanded. However, there are many biases preventing such uniformity. These biases may be due to equipment difference of apparatuses or non-uniformity of plasma distribution in an apparatus.

SUMMARY OF THE INVENTION

In accordance with one aspect of the present invention, there is provided an apparatus for plasma treatment. The apparatus includes a process vessel provided with a mounting table for mounting a substrate; a first gas supplying unit configured to supply a first gas into the process vessel; a first plasma generating unit configured to convert at least a part of the first gas to a first plasma; a second gas supplying unit configured to supply a second gas into the process vessel; and a second plasma generating unit configured to convert at least a part of the second gas to a second plasma. In the apparatus, a height of an inlet of the second gas from the mounting table is lower than a height of an inlet of the first gas from the mounting table.

In accordance with second aspect of the present invention, there is provided an apparatus for plasma treatment. The apparatus includes a process vessel provided with a mounting table for mounting a substrate; a first gas supplying unit configured to supply a first gas into the process vessel, an inlet of which being located on an upper side of the process vessel; a first plasma generating unit configured to convert at least a part of the first gas to a first plasma; a second gas supplying unit configured to supply a second gas into the process vessel, an inlet of which being located on a side wall of the process vessel; and a second plasma generating unit configured to convert at least a part of the second gas to a second plasma.

In accordance with third aspect of the present invention, there is provided a method for plasma treatment. The treatment is conducted in a process vessel provided with a mounting table for mounting a substrate. The method includes the steps of supplying a first gas from a first inlet into the process vessel; converting at least a part of the first gas to a first plasma; supplying a second gas from a second inlet into the process vessel; and converting at least a part of the second gas to a second plasma. In the method, a height of the second inlet from the mounting table is lower than a height of the first inlet from the mounting table.

BRIEF DESCRIPTION OF DRAWINGS

FIG. 5 illustrates a cross-sectional view of a modified example of the apparatus for plasma treatment according to one embodiment of the present invention.

FIG. 6-A illustrates a cross-sectional view of an example of the apparatus for plasma treatment according to another embodiment of the present invention.

FIG. 6-B illustrates a schematic view of a second gas supplying unit of the apparatus shown in FIG. 6-A.

FIG. 7-A illustrates a cross-sectional view of an example of the apparatus for plasma treatment according to another embodiment of the present invention.

FIG. 7-B illustrates a schematic view of a mounting table of the apparatus shown in FIG. 7-A.

FIG. 8 illustrates a cross-sectional view of an example of the apparatus for plasma treatment according to another embodiment of the present invention.

DETAILED DESCRIPTION OF INVENTION

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

Figure 1:
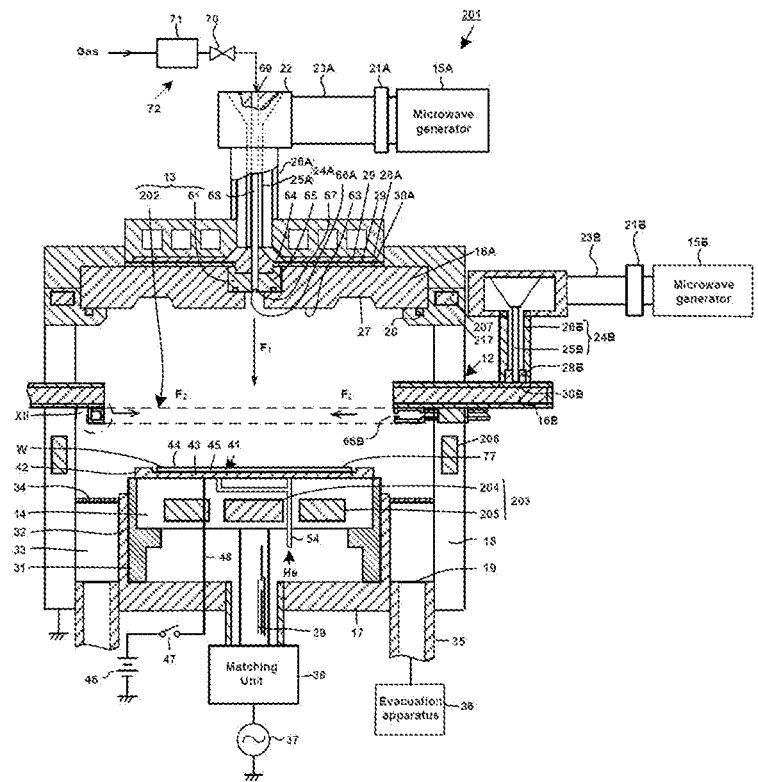
FIG. 1 illustrates a cross-sectional view of an example of the apparatus for plasma treatment according to one embodiment of the present invention.

FIG. 1 illustrates a cross-sectional view of an example of the apparatus for plasma treatment according to one embodiment of the present invention. The apparatus 201 contains a process vessel 12, a first gas supplying unit 61 configured to supply a first gas flow $F_1$ into the process vessel 12, a first plasma generating unit containing a first microwave generator 15A, a second gas supplying unit 202 configured to supply a second gas flow $F_2$ into the process vessel 12, and a second plasma generating unit containing a second microwave generator 15B. The process vessel 12 is provided with a mounting table 14 for mounting a substrate W. Inlet of the first gas 66A and inlet of the second gas 66B are different in height from the mounting table 14. More specifically, a height of the inlet of the second gas 66B from the mounting table 14 is lower than a height of the inlet of the first gas 66A from the mounting table 14. In the apparatus 201 shown in FIG. 1, the inlet of the first gas 66A is located on an upper side of the process vessel 12, and the inlet of the second gas 66B is located on a side wall of the process vessel 12.

The apparatus 201 includes an evacuation apparatus 36 for evacuating the inside of the process vessel 12. The evacuation apparatus 36 also functions as a pressure adjusting means for adjusting the pressure inside the process vessel 12 to a desired pressure. In the mounting table 14, a high frequency power source 37 for RF (radio frequency) bias is electrically connected to the electrode thereof via a matching unit 38. This high frequency power source 37, as a bias electric power supply means, outputs a constant frequency suitable for controlling the energy of the ion drawn into the substrate W, for example, a high frequency of 13.56 MHz, which is output with predetermined power and supplied towards the mounting table 14. The matching unit 38 accommodates an impedance matching box for achieving a matching between impedance on high frequency power source 37 and impedance on load side, the side mainly including an electrode, plasma, the process vessel 12 etc. Inside this impedance matching box is included a blocking condenser for auto bias generation. Although not illustrated, it is also possible to provide a support mechanism to support the substrate W, and a temperature adjustment mechanism to regulate the temperature.

The first gas supplying unit 61 is provided with the inlet of the first gas 66A through which the first gas is supplied toward the substrate W. The second gas supplying unit 202 includes a circular hollow member and is provided with the inlet of the second gas 66B through which the second gas is supplied towards the inner side of the process vessel 12 in a radial direction. The first gas supplying unit 61 and the second gas supplying unit 202 respectively supply gas, such as those for plasma treatment, from the outside of the process vessel 12 to the inside of the process vessel 12.

The first plasma generating unit is configured to convert at least a part of the first gas to first plasma. The first plasma generating unit contains the first microwave generator 15A configured to generate a first microwave and a member configured to change polarization characteristics of the first microwave. The member contains a first dielectric plate 28A, a first dielectric window 16A, and a first slot antenna plate 30A intervening between the first dielectric plate 28A and the first dielectric window 16A.

As described earlier, the first microwave generator 15A is configured to generate a first microwave. The first microwave generated by the first microwave generator 15A is directed through a first waveguide tube 23A and a first coaxial waveguide tube 24A to reach the first dielectric plate 28A. The first microwave having propagated in the first dielectric plate 28A goes through a plurality of slots provided in the first slot antenna plate 30A. The first microwave radiated from the slots propagates in a first dielectric window 16A. The first microwave having passed through the first dielectric window 16A generates an electric field directly below the first dielectric window 16A and converts at least a part of the first gas into first plasma. The first plasma generated directly below the first dielectric window 16A continues to diffuse in a direction away from the first dielectric window 16A, that is, in the direction of the mounting table 14.

Figure 2:
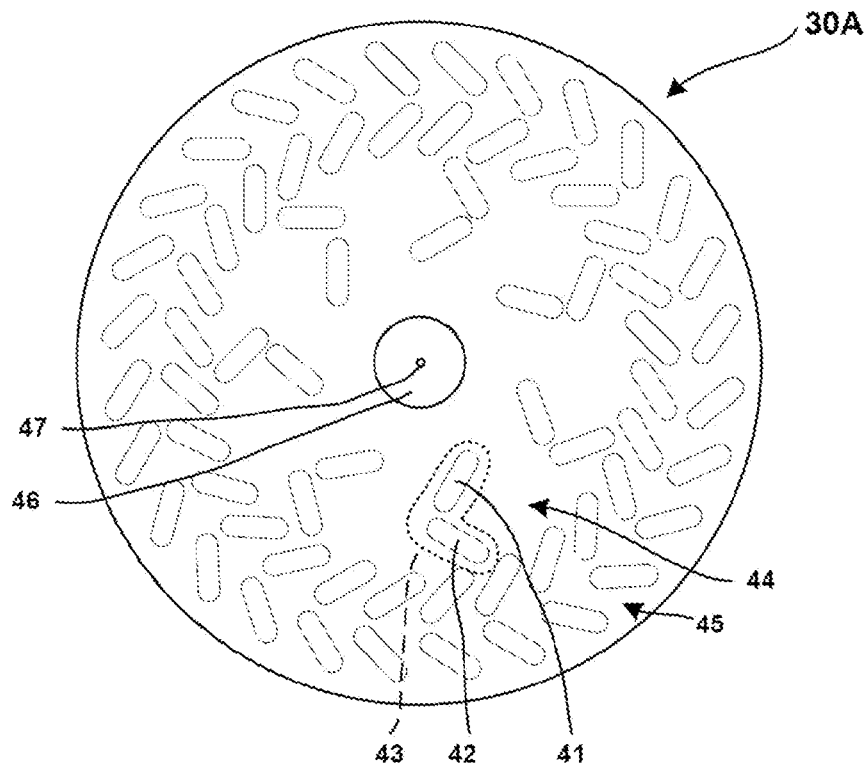
FIG. 2 illustrates a schematic view of the slot antenna plate of the apparatus shown in FIG. 1.

FIG. 2 illustrates a schematic view of the slot antenna plate of the apparatus shown in FIG. 1. The slot antenna plate 30A shown in FIG. 2 is made from a conductor, and is in the form of a thin circular disc. A plurality of slots, which penetrate in the thickness direction of the panel, is provided in the slot antenna plate 30A. Each of the slots is constituted such that a first long slot 41 elongating in one direction and a second long slot 42 perpendicular to the first long slot 41 are adjacent to each other and form a pair. Specifically, they are disposed such that the two adjacent slots become a pair and are in T-shape. The provided slot pair 43 is divided roughly into an inner circumference slot group 44 disposed on the inner circumference, and a peripheral slot group 45 disposed on the perimeter side. In the inner circumference slot group 44, seven slot pairs 43 are disposed respectively at equal intervals in the circumferential direction. In the peripheral slot group 45, twenty-eight slot pairs 43 are disposed respectively at equal intervals in the circumferential direction. A through-hole 46 is provided also at the center of the radial direction of the slot antenna plate 30A. The slot antenna plate 30A has a rotational symmetry around the center 47. Note that the configuration of the slots provided in the slot antenna plate 30A is arbitrary and can be different from the one shown in FIG. 2.

The first dielectric window 16A is a substantially circular plate having a predetermined plate thickness. The first dielectric window 16A is constituted from a dielectric material. As the dielectric material, silica, quarts, aluminum nitride, and alumina can be exemplified. The first dielectric window 16A is hermetically sealed to the apparatus 201 such that it is mounted atop the annular member 217. The first dielectric window 16A has indentation sections 27 with an indent in the form of a taper towards the plate thickness direction. Subsequently, depending on various plasma conditions, it is possible to ensure high stability of the plasma in the lower region of the first dielectric window 16A.

Similarly, the second plasma generating unit is configured to convert at least a part of the second gas to second plasma. The second plasma generating unit contains the second microwave generator 15B configured to generate a second microwave and a member configured to change polarization characteristics of the second microwave. The member contains a second dielectric plate 28B, a second dielectric window 16B, and a second slot antenna plate 30B intervening between the second dielectric plate 28B and the second dielectric window 16B. The second dielectric plate 28B and the second dielectric window 16B may be ring-shaped surrounding the side wall of the process vessel 12. The second slot antenna plate 30B may be a conductor provided with a plurality of slot holes. The slot holes may be provided partly or entirely in the second slot antenna plate 30B.

The second microwave generator 15B is configured to generate a second microwave. The second microwave generated by the second microwave generator 15B is directed through a second waveguide tube 23B and a second coaxial waveguide tube 24B to reach a second dielectric plate 28B. The second microwave having propagated in the second dielectric plate 28B goes through a plurality of slots provided in a second slot antenna plate 30B. The second microwave radiated from the slots propagates in a second dielectric window 16B. The second microwave having passed through the second dielectric window 16B generates an electric field directly aside the second dielectric window 16B and converts at least a part of the second gas into second plasma. The second plasma generated directly aside the second dielectric window 16B diffuses in a direction away from the second dielectric window 16B and then, by an action of gravity, in a direction onto the mounting table 14 together with the first plasma.

The first and second plasma generated as above cooperatively act on the substrate W. Accordingly, the substrate W undergoes plasma treatments such as plasma etching, plasma CVD, plasma sputtering etc. As described earlier, a height of the inlet of the second gas 66B from the mounting table 14 is lower than a height of the inlet of the first gas 66A from the mounting table 14. Therefore, the height of the region where the second plasma is generated is lower than the height of the region where the first plasma is generated. The inventors have found that the electron temperature of the first plasma becomes lower as it approaches to the mounting table 14, especially in the region corresponding to the peripheral of the mounting table 14. Such non-uniformity of plasma distribution in an apparatus can be one reason for preventing uniform in-plane treatment of the substrate. From this insight, the inventors have conceived an idea to introduce a unit for generating the second plasma below a unit for generating the first plasma, thereby making it possible to compensate plasma density distribution. Actually, employing such constitution is found to have a significant effect on improving the in-plane uniformity of the plasma treatment of the substrate.

In the apparatus 201, the in-plane uniformity of the plasma treatment can be adjusted by controlling at least one of the power of the first plasma generating unit, the power of the second plasma generating unit, the amount of the first gas, and the amount of the second gas. For example, the apparatus 201 may further include a controller for adjusting a power ratio of the first plasma generating unit and the second plasma generating unit. Independently or additionally, the apparatus 201 may further include a controller for adjusting an amount ratio of the first gas and the second gas. These controllers may enable more delicate adjustment of the in-plane uniformity of the plasma treatment.

Interface of the second plasma generating unit facing the inside of the process vessel 12 is preferably located close to the inlet of the second gas 66B. In the apparatus 201 shown in FIG. 1, for example, the interface is located just above the inlet of the second gas 66B. Employing such configurations can make the second plasma generating unit convert at least a part of the second gas to the second plasma immediately after the second gas enters the process vessel 12. Prompt conversion of the second gas to the second plasma makes it possible to more delicately control the in-plane uniformity of the plasma treatment.

As for the first and the second gas, all kinds of gas which can be converted to plasma may be employed. As such, argon (Ar), krypton (Kr), hydrogen bromide (HBr), ammonia ($NH_3$), nitrogen ($N_2$), trifluoromethane ($CHF_3$), fluorocarbon ($C_xF_y$), and combination thereof can be exemplified. Note that the kind of the first gas and the second gas may be the same or different from each other.

The present inventors have found that when the first gas contains hydrogen bromide (HBr) and the second gas is not employed, the in-plane uniformity of the plasma treatment is relatively poor. Therefore, when the first gas contains hydrogen bromide (HBr), the compensation of the first plasma by the second plasma in the apparatus 201 is especially effective.

The present inventors have also found that the dissociation of such gases as ammonia ($NH_3$), nitrogen ($N_2$), and trifluoromethane ($CHF_3$) require higher energy when compared to such gases as hydrogen bromide. In the apparatus 201, the electron temperature near the inlet of the second gas 66B is high due to the presence of the second plasma generating unit. Therefore, the in-plane uniformity of the plasma treatment can be readily achieved even when such gases as ammonia ($NH_3$), nitrogen ($N_2$), and trifluoromethane ($CHF_3$) are employed as the second gas.

The in-plane uniformity of the plasma treatment can further be improved by employing two or more gases which are different in dissociation constant as the second gas. Use of the mixture of two or more gases which are different in dissociation constant can make it possible to more delicately control the distribution of the second plasma in the process vessel 12. For example, ammonia ($NH_3$) has high dissociation constant, which is more than $1\times10^{-13}$ $cm^2/s$ at 1 eV. On the other hand, nitrogen ($N_2$), and trifluoromethane ($CHF_3$) have lower dissociation constant, both of which being less than $1\times10^{-14}$ $cm^2/s$ at 1 eV. By using the mixture of two more gases containing a gas with high dissociation constant and a gas with low dissociation constant as the second gas, and by controlling the amount ratio thereof, more delicate control the distribution of the second plasma can be achieved.

In the apparatus 201 shown in FIG. 1, coaxial waveguide tubes are employed to supply the microwaves. However, other waveguide tubes such as circular waveguide tube or rectangular waveguide tube etc. may also be employed.

As in the apparatus 201 shown in FIG. 1, the first plasma generating unit and the second plasma generating unit are preferably separated from each other. Employing such configuration may reduce the interference and resonance of the microwaves.

In the apparatus 201 shown in FIG. 1, the frequency of the first microwave and the second microwave are preferably different from each other. Employing such configuration may reduce the interference and resonance of the microwaves. The difference between the two frequencies may be set to, for example, 2 to 3% based on the higher frequency.

In the apparatus 201 shown in FIG. 1, the second dielectric plate 28B is provided on top of the second dielectric window 16B. However, the positional relationship of the second dielectric plate 28B and the second dielectric window 16B is arbitrary.

Figure 3:
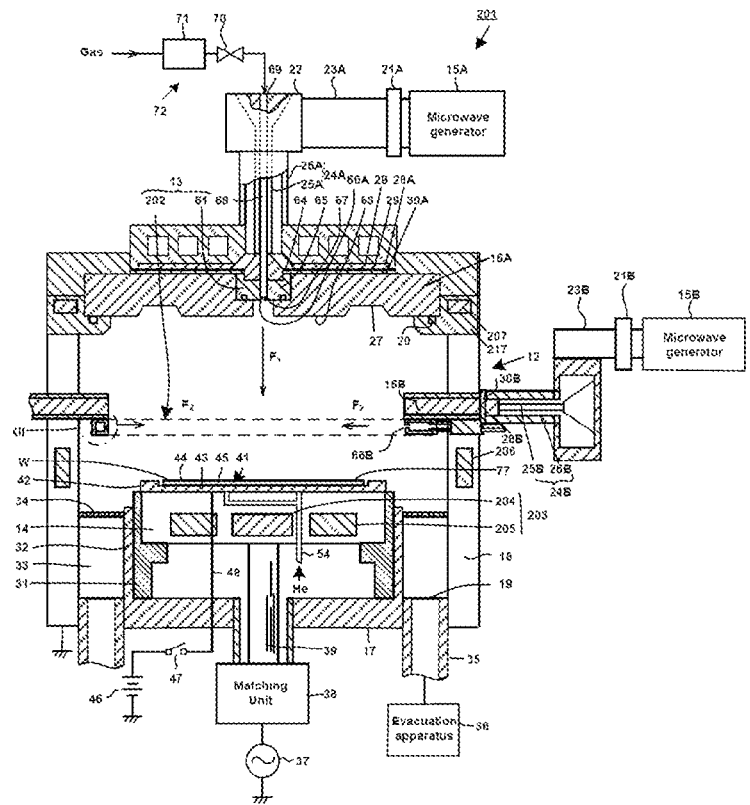
FIG. 3 illustrates a cross-sectional view of a modified example of the apparatus for plasma treatment according to one embodiment of the present invention.

FIG. 3 illustrates a cross-sectional view of a modified example of the apparatus for plasma treatment according to one embodiment of the present invention. In the apparatus 201 shown in FIG. 3, the second dielectric plate 28B is provided horizontally with the second dielectric window 16B. Such configuration can also improve the in-plane uniformity of the plasma treatment. Although not shown as a figure, the second dielectric plate 28B can also be provided below the second dielectric window 16B.

In the apparatus 201 shown in FIGS. 1 and 3, both the first and the second plasma generating unit contain a microwave generator. However, both of these units do not necessarily generate plasma by using a microwave generator. For example, at least one of the units may generate plasma by using another mechanism than a microwave generator, such as a coil configured to generate inductively coupled plasma (ICP).

Figure 4:
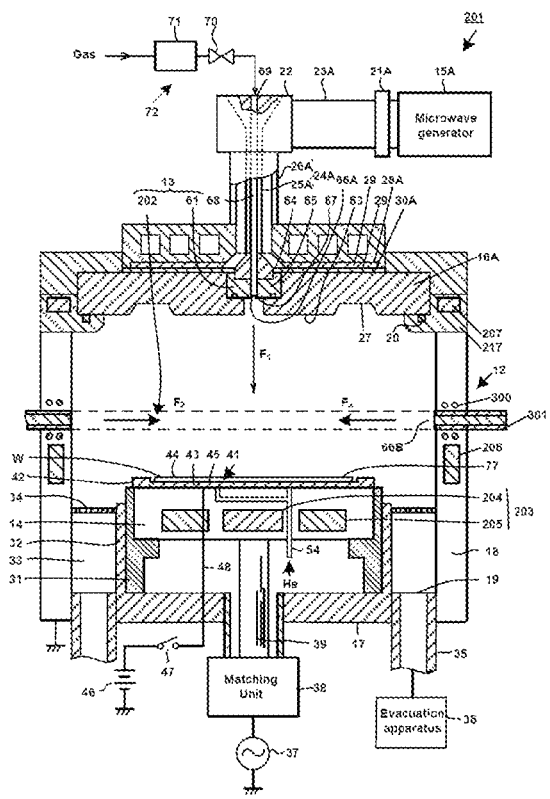
FIG. 4 illustrates a cross-sectional view of a modified example of the apparatus for plasma treatment according to one embodiment of the present invention.

FIG. 4 illustrates a cross-sectional view of a modified example of the apparatus for plasma treatment according to one embodiment of the present invention. In the apparatus 201 shown in FIG. 4, the second plasma generating unit contains a gas tube 301 through which the second gas is supplied and a coil 300 located on the outside of the gas tube 301. The coil 300 is configured to generate a magnetic field to convert at least a part of the second gas to the second plasma by inductively coupled plasma (ICP) mechanism. Such configuration can also improve the in-plane uniformity of the plasma treatment.

The apparatus 201 may further contain additional parts which can improve the in-plane uniformity of the plasma treatment or any other properties. FIG. 5 illustrates a cross-sectional view of a modified example of the apparatus for plasma treatment according to one embodiment of the present invention. The apparatus 201 shown in FIG. 5 is the same as the apparatus 201 shown in FIG. 1 except that it further contains an inclined part 210 in the second plasma generating unit. The inclined part 210 makes it easier to convert at least a part of the second gas to second plasma by allowing the electric field generated by the second microwave to more readily interact with the second gas.

The method for plasma treatment according to one embodiment of the present invention typically employs the apparatus 201. The method includes the steps of supplying a first gas from a first inlet into the process vessel; converting at least a part of the first gas to a first plasma; supplying a second gas from a second inlet into the process vessel; and converting at least a part of the second gas to a second plasma. Here, a height of the second inlet from the mounting table is lower than a height of the first inlet from the mounting table.

Examples of the plasma treatment realized by the method includes: plasma etching, plasma CVD, plasma ALD, plasma sputtering, and plasma doping. The method is particularly useful for plasma etching. Especially, in the etching process of multilayer films (e.g. three-layer etching process of SiARC/organic film/SiN/Si), uniform in-plane processing can be carried out by suitably adjusting the power of first and second microwaves and/or the amount of the first and second gases during the course of processing of each target film.

The method for plasma treatment can improve the uniformity of the in-plane treatment. Therefore, the method is preferably employed when the substrate to be treated is large in size. For example, the method is particularly useful when treating semiconductor wafer or glass substrate whose diameter is 450 mm or larger.

Other embodiments can also be employed to improve the in-plane uniformity of the plasma treatment. Hereinafter, examples of plasma etching will be described. The embodiments, however, can be applied to other plasma treatments including plasma CVD, plasma ALD, plasma sputtering, and plasma doping.

FIG. 6-A illustrates a cross-sectional view of an example of the apparatus for plasma treatment according to another embodiment of the present invention. FIG. 6-B illustrates a schematic view of a second gas supplying unit of the apparatus shown in FIG. 6-A. In FIG. 6-A and FIG. 6-B, an apparatus for plasma treatment is provided in which the outer gas supplying unit is divided into a plurality of zones and in which it is possible to supply a gas independently into each zone. It is also possible to provide a configuration to supply a gas to each zone at different gas flow rate.

The gas is supplied from the periphery of the target substrate towards the center of the chamber or in the direction of the target substrate. The outer gas supplying unit may be provided inside the side wall of the processing container (not illustrated), and it may also be a ring-shaped gas supplying unit projecting from the wall as shown in FIG. 6-A and FIG. 6-B.

For each gas supply zones, the gas mixture (such as noble gas, $CF_x$ gas etc.) used in etching is distributed in a splitter and supplied. It is also possible to distribute the gas mixture used in etching to the center gas supplying unit and outer gas supplying unit by using a splitter and the gas mixture distributed to the outer gas supplying unit may be distributed to each gas supply zone by using a splitter. For each zone of the gas supply, gases of different mixing ratios may be supplied. The outer gas supplying unit is made from, for example, quartz or ceramics (e.g. SiC). Multiple zones can contain 3 to 10 parts, and multiple zones containing 4 to 6 parts are preferable.

Each supporting sections preferably functioning as both the pipes for supplying gas to each zone and the connecting section to the processing container may be supported such that the stress applying on the outer gas supplying unit can be avoided even if the outer gas supplying unit thermally expands. Specifically, the respective supporting sections may be supported so as to move freely.

By supplying gases with different flow rates or different kinds of gas mixtures in the circumferential direction, it becomes possible to improve as well as adjust the uniformity of plasma treatment in the circumferential direction. It is also possible to correct the bias of the plasma in the radial direction due to gas flow rate. It is also possible to correct the uniformity of plasma processing in the circumferential direction caused by bias due to equipment differences between the devices or assembly errors or due to the structure of the bias electrode.

FIG. 7-A illustrates a cross-sectional view of an example of the apparatus for plasma treatment according to another embodiment of the present invention. FIG. 7-B illustrates a schematic view of a mounting table of the apparatus shown in FIG. 7-A.

FIG. 7-A and FIG. 7-B show an apparatus for plasma treatment in which an ESC (electrostatic chuck) is connected on the mounting table. The electrode (first electrode) for absorption of static electricity inside ESC is superimposed with a power source and a first RF power source for ESC. A ring-shaped electrode (2nd electrode) is installed in the internal periphery of ESC, and a RF power source is connected to this second electrode. The bias applied to the target substrate using first electrode and second electrode is adjusted in the radial direction. Note that, in FIG. 7-A and in FIG. 7-B, a description of blocking condensers and matching units has been omitted.

It is also possible to provide a plurality of ring-shaped electrodes. Each electrode is connected to its respective RF power source. In FIG. 7-B, a second electrode and a third electrode are provided at the bottom of the first electrode. In this way, by providing a second electrode and a third electrode at the bottom of the first electrode, electrode-free regions (gaps) are eliminated. Since the regions without electrode are regions where bias is not applied, there is risk of affecting the in-plane uniformity of the substrate treatment.

It is also possible to configure the frequency of the RF applied to the first electrode and the frequency of RF applied to second and third electrodes so as to apply correspondingly different frequencies by taking into consideration the interference to the matching unit. For example, when an RF of 13.56 MHz is applied to the first electrode, an RF of 13.28 MHz will be applied to the second electrode, and an RF of 13.83 MHz will be applied to the third electrode. Frequencies can vary by 2% to 10%.

Further, it is also possible to configure an apparatus for plasma treatment in which ESC is connected on the mounting table, the electrodes of ESC are divided into several numbers in the radial direction, each of these electrodes is superimposed with power source for ESC and power source of RF application such that the power can be individually controlled, and the bias that will be applied to the target substrate can be adjusted in the radial direction.

By adjusting in the radial direction the bias power applied to the target substrate, it becomes possible to adjust the etching rate or shape differences that change in the peripheral direction from the center of the target substrate. It can be preferably used for the etching of polysilicon, silicon nitride and silicon oxide. Moreover, the resist mask can be preferably used since the effect of change in bias is large in the etching of resist mask.

Figure 9:
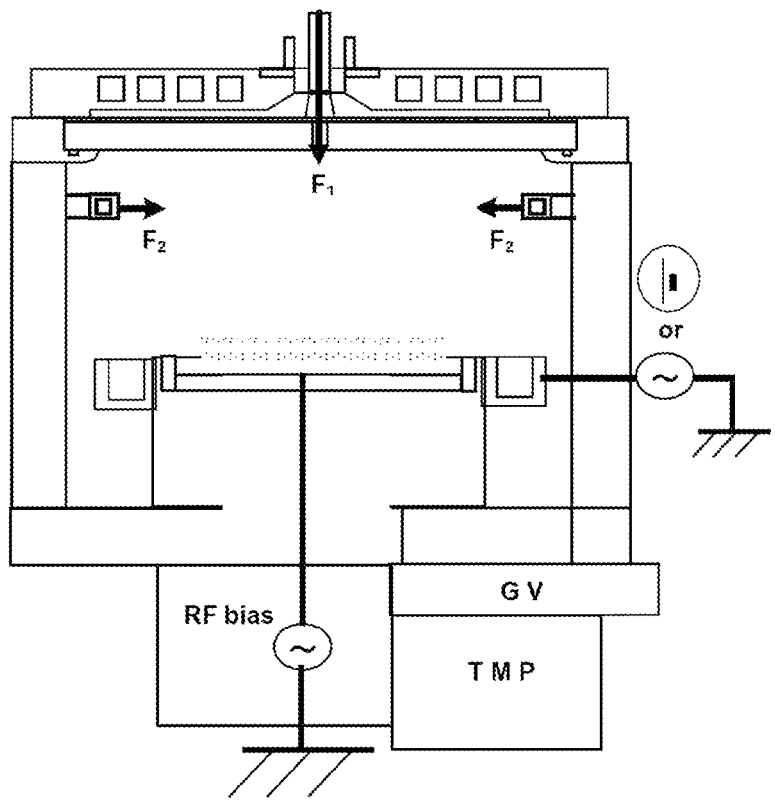
FIG. 9 illustrates a cross-sectional view of an example of the apparatus for plasma treatment according to another embodiment of the present invention.

FIG. 8 illustrates a cross-sectional view of an example of the apparatus for plasma treatment according to another embodiment of the present invention. FIG. 9 illustrates a cross-sectional view of an example of the apparatus for plasma treatment according to another embodiment of the present invention. FIG. 8 and FIG. 9 represent an apparatus for plasma treatment characterized by being provided with a ring-shaped member in the plasma processing container, applying an RF or DC to the ring-shaped member, etching (sputtering) the ring-shaped member, and thereby controlling the radical concentration in the plasma space.

It is possible to provide a ring-shaped member in the side wall of the processing container (FIG. 8). It is also possible to provide a ring-shaped member in the circumference of the target substrate (FIG. 9).

The ring-shaped member materials may be based on silicon (Si) or carbon (C). The ring-shaped member materials may be based on material containing Group 4 materials. Ring-shaped member materials may be composed of Group 3 and Group 5 materials. The gas used for the treatment may contain halogen. The gas used for the treatment may be a gas containing at least carbon (C) and fluorine (F), chlorine (Cl), bromine (Br), iodine (I) or hydrogen (H).

By etching the ring-shaped member, it becomes possible to adjust concentration of radical species and ionic species in the plasma, and it becomes possible to improve such as the selectivity and etching rate etc. in the etching on the target substrate. Specifically, when the ring-shaped member is Si, and the etching gas contains $CF_x$ and Ar, the etching gas is ionized (conversion to plasma) and F radicals are generated. During this, RF bias is applied to the ring-shaped member made of Si, and Si is etched by Ar. As a result, radical state Si is generated in the processing container, and $SiF_4$ is formed by the bonding between Si and F. Si and F bond to each other easily. The formed $SiF_4$ is evacuated, and as a result, the number of F radicals in the processing container can be reduced. By varying the magnitude of the bias, the amount of etching of Si can be adjusted, and it also becomes possible to adjust the amount of F that is removed for example.

Although ions and radicals with suitable bonding are required for performing the desired etching, by adopting this configuration, the concentration of radical species can be controlled, and when etching $SiO_2$ with proper amount of F ions and F radicals, it has the effect of such as increasing the etching selectivity with Si etc.

If the ring-shaped member is made of C and the etching gas contains $CF_x$ and Ar, the etching gas is ionized (converted to plasma), and F radicals are generated. During this, RF bias is applied to the ring-shaped member made of C, and C is etched by Ar. As a result, radical state C is produced, and combines with F to form $CF_x$. Because of the depositing nature of $CF_x$, by depositing on the target substrate, the amount of etching of the target substrate can be controlled. Further, it is also possible to reduce the number of F radicals. C used in the ring-shaped member is typically a glass-like carbon.

Figure 10:
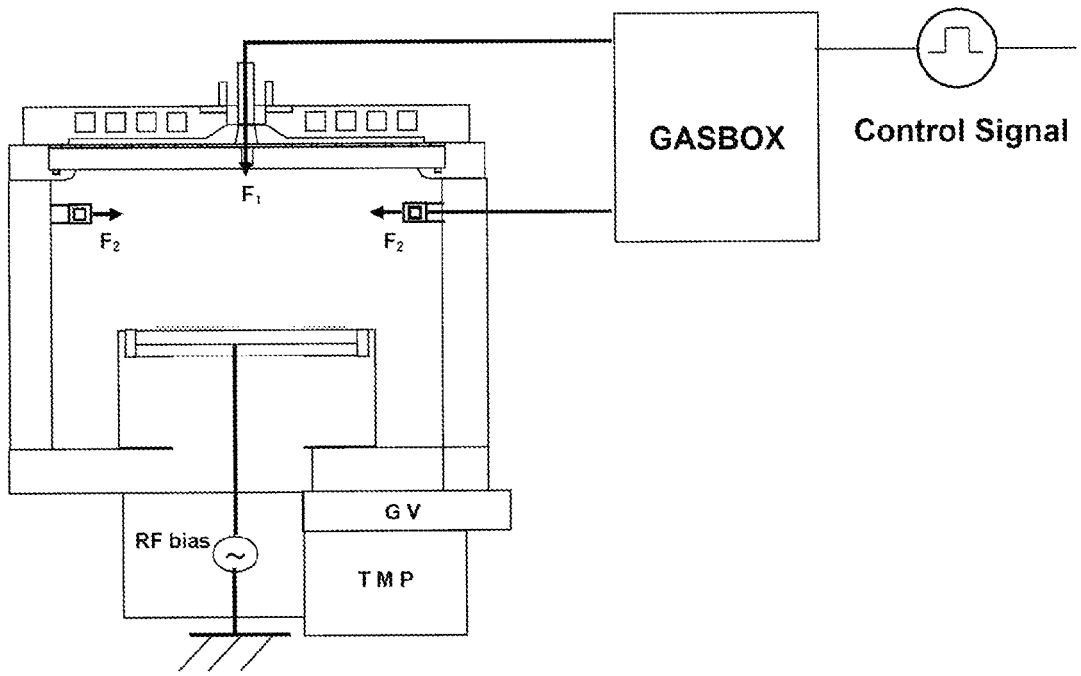
FIG. 10 illustrates a cross-sectional view of an example of the apparatus for plasma treatment according to another embodiment of the present invention.
Figure 11:
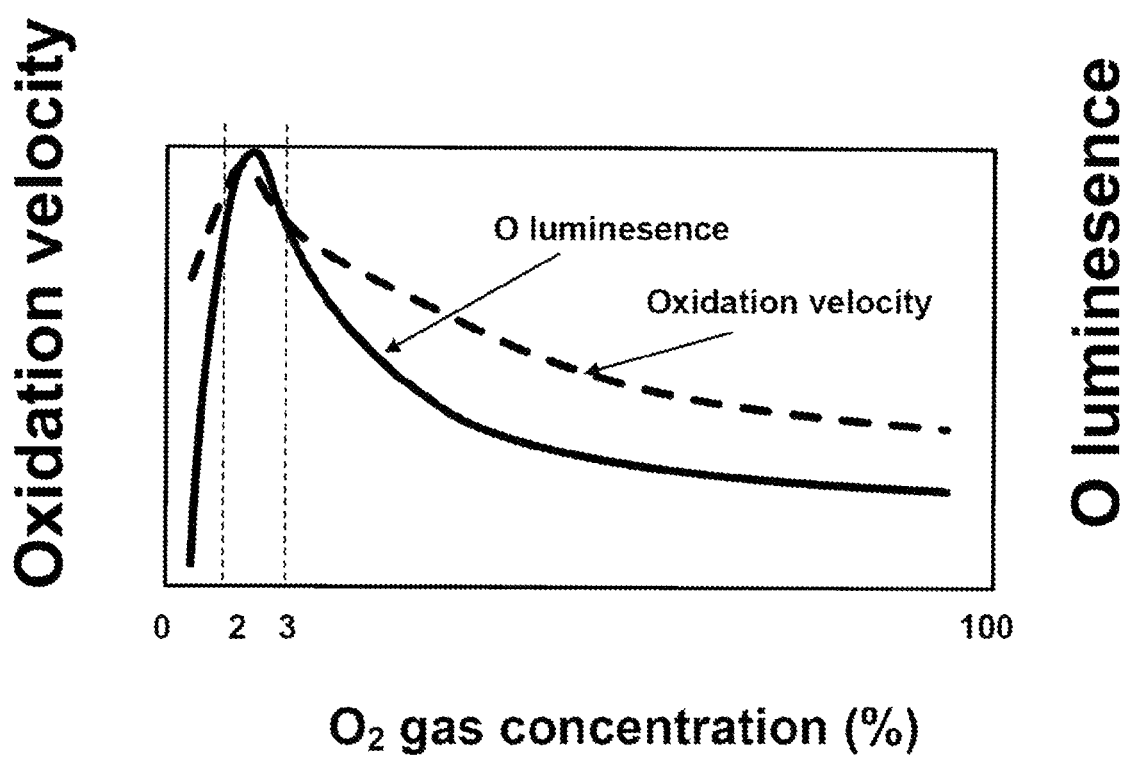
FIG. 11 depicts a graph showing an example of a relationship between oxygen gas concentration and oxidation velocity or oxygen luminescence.

FIG. 10 illustrates a cross-sectional view of an example of the apparatus for plasma treatment according to another embodiment of the present invention. FIG. 11 depicts a graph showing an example of a relationship between oxygen gas concentration and oxidation velocity or oxygen luminescence.

Although appropriate amounts of radicals and ions become necessary for performing the desired etching, sometimes it was not possible to control the concentration of radical species in the dissociation by plasma alone. The vertical axis in FIG. 11 represents the emission intensity of oxygen (O) plasma and oxidation rate (equal to the etching rate in case of etching), whereas the horizontal axis represents the concentration of the oxygen ($O_2$) gas. The region wherein the emission intensity of oxygen (O) plasma is high and the oxidation speed is faster (dotted line area) is a region where the oxygen ($O_2$) gas concentration based on that of the inert gas (for example, Ar) is 2%-3%. This region is a desired region for enhancing the throughput to speed up the rate of treatment. However, in this region, since the radical concentration is prone to changes due to fluctuations in the flow rate of the gas, controlling was difficult due to the problem of reproducibility of the process or equipment differences between devices.

FIG. 10 shows an apparatus for plasma treatment characterized by having a controller for supplying intermittently (ON/OFF) one or more gases used in plasma processing or for repeatedly varying the flow rate.

With the aim of repeating the flow rate region that is near to the region of the peak that changes in convex or concave shape when the gas flow is increased, the ON/OFF or flow rate control of a gas is performed. With this, the characteristics are averaged thereby realizing reproducibility and mitigation of the equipment differences between the devices. For the gas, the ON/OFF is typically adjusted at intervals of about 0.5 to 1 per second, or the flow rate can be adjusted at intervals of about 0.5 to 1 per second.

In particular, it can be ideally used in the etching treatment, ashing treatment, oxidation treatment, CVD treatment and ALD treatment using a gas containing $O_2$ or halogen.

While the principles of the disclosure have been described above in connection with specific apparatuses and methods, it is to be clearly understood that this description is made only by way of example and not as limitation on the scope of the invention.

The invention claimed is:

1. An apparatus for plasma treatment comprising:
   a process vessel provided with a mounting table for mounting a substrate;
   a first gas supplying unit configured to supply a first gas into the process vessel through a first gas inlet;
   a first plasma generating unit including a first mechanism configured to generate a first microwave to convert at least a part of the first gas supplied through the first gas inlet to a first plasma;
   a second gas supplying unit configured to supply a second gas into the process vessel through a second gas inlet; and
   a second plasma generating unit including a second mechanism configured to generate a second microwave to convert at least a part of the second gas supplied through the second gas inlet to a second plasma, the second plasma being a plasma separately generated from the first plasma using the second plasma generating unit,
   wherein a height of the second gas inlet from the mounting table is lower than a height of the first gas inlet from the mounting table,
   the first gas inlet is located on an upper side of the process vessel directed toward the substrate in a vertical direction to diffuse the first plasma generated by the first plasma generating unit in a direction perpendicular to the mounting table, and
   the second gas inlet is located on a side wall of the process vessel directed towards an inner side of the process vessel in a horizontal direction to diffuse the second plasma generated by the second plasma generating unit in a direction parallel to the mounting table.

2. The apparatus of claim 1, wherein the second plasma generating unit converts at least a part of the second gas to the second plasma immediately after the second gas enters the process vessel.

3. The apparatus of claim 1, wherein the second gas inlet is located on a side wall of the process vessel.

4. The apparatus of claim 1, wherein the first plasma generating unit and the second plasma generating unit are separated from each other.

5. The apparatus of claim 1, wherein a frequency of the first microwave is different from a frequency of the second microwave.

6. The apparatus of claim 1, further comprising a controller for adjusting a ratio of an amount of the first gas to an amount of the second gas.

7. The apparatus of claim 1, wherein the first gas contains hydrogen bromide.

8. The apparatus of claim 1, wherein the second plasma generating unit comprises a coil configured to generate an inductively coupled plasma.

9. The apparatus of claim 1, wherein the second gas contains at least two gases with different dissociation constants.

10. The apparatus of claim 1, wherein the second plasma generating unit comprises a member configured to change polarization characteristics of the microwave.

11. The apparatus of claim 10, wherein the member comprises:
 a first dielectric window and a second dielectric window; and
 a conductor provided with a plurality of slots, the conductor intervening between the first dielectric window and the second dielectric window.

12. An apparatus for plasma treatment comprising:
 a process vessel provided with a mounting table for mounting a substrate;
 a first gas supplying unit configured to supply a first gas into the process vessel through a first gas inlet;
 a first plasma generating unit including a first mechanism configured to generate a first microwave to convert at least a part of the first gas to a first plasma;
 a second gas supplying unit configured to supply a second gas into the process vessel through a second gas inlet; and
 a second plasma generating unit including a second mechanism configured to generate a second microwave to convert at least a part of the second gas to a second plasma, the second plasma being a plasma separately generated from the first plasma using the second plasma generating unit,
 wherein the first gas inlet is located on an upper side of the process vessel directed toward the substrate in a vertical direction to diffuse the first plasma generated by the first plasma generating unit in a direction perpendicular to the mounting table, and
 the second gas inlet is located on a side wall of the process vessel directed towards an inner side of the process vessel in a horizontal direction to diffuse the second plasma generated by the second plasma generating unit in a direction parallel to the mounting table.

13. A method for plasma treatment, the treatment being conducted in a process vessel provided with a mounting table for mounting a substrate, the method comprising:
 supplying a first gas from a first gas inlet into the process vessel;
 generating a first microwave to convert at least a part of the first gas to a first plasma using a first plasma generating unit;
 supplying a second gas from a second gas inlet into the process vessel; and
 generating a second microwave to convert at least a part of the second gas to a second plasma, the second plasma being a plasma separately generated from the first plasma using a second plasma generating unit,
 wherein a height of the second gas inlet from the mounting table is lower than a height of the first gas inlet from the mounting table,
 the first gas inlet is configured to diffuse the first plasma generated by the first plasma generating unit in a direction perpendicular to the mounting table, and
 the second gas inlet is configured to diffuse the second plasma generated by the second plasma generating unit in a direction parallel to the mounting table.

14. The method of claim 13, wherein at least a part of the second gas is converted to the second plasma immediately after the second gas enters the process vessel.

15. The method of claim 13, wherein the second gas inlet is located on a side wall of the process vessel.

16. The method of claim 13, wherein the first gas contains hydrogen bromide.

17. The method of claim 13, wherein the second plasma generating unit comprises a member configured to change polarization characteristics of the microwave.

18. The method of claim 13, wherein the second plasma generating unit comprises a coil configured to generate an inductively coupled plasma.

19. The method of claim 13, wherein the second gas contains at least two gases with different dissociation constants.

* * * * *